United States Patent
Park

(10) Patent No.: US 8,508,263 B2
(45) Date of Patent: Aug. 13, 2013

(54) SEMICONDUCTOR DEVICE, METHOD FOR OPERATING THE SAME, AND MEMORY SYSTEM INCLUDING THE SAME

(75) Inventor: Nak-Kyu Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 191 days.

(21) Appl. No.: 12/832,708

(22) Filed: Jul. 8, 2010

(65) Prior Publication Data

US 2011/0267114 A1 Nov. 3, 2011

(30) Foreign Application Priority Data

Apr. 29, 2010 (KR) ........................ 10-2010-0039888

(51) Int. Cl.
*H03L 7/00* (2006.01)

(52) U.S. Cl.
USPC .......................................... 327/143; 327/142

(58) Field of Classification Search
USPC .................... 327/142, 147, 156, 143
See application file for complete search history.

(56) References Cited

U.S. PATENT DOCUMENTS

| | | | |
|---|---|---|---|
| 6,525,988 B2 | 2/2003 | Ryu et al. | |
| 7,414,447 B2 | 8/2008 | Cho | |
| 7,683,684 B2 * | 3/2010 | Lee et al. | 327/158 |
| 7,868,673 B2 * | 1/2011 | Lee et al. | 327/158 |
| 2009/0121784 A1 * | 5/2009 | Lee et al. | 327/544 |

FOREIGN PATENT DOCUMENTS

| | | |
|---|---|---|
| KR | 100146083 | 12/1998 |
| KR | 1020000005652 | 1/2000 |
| KR | 100873624 | 12/2008 |

* cited by examiner

*Primary Examiner* — Hai L Nguyen
(74) *Attorney, Agent, or Firm* — IP & T Group LLP

(57) ABSTRACT

A semiconductor device includes a clock supply circuit configured to generate an internal clock by using an external clock, an internal circuit configured to operate in synchronization with the internal clock and enter a power-down mode in response to a power-down signal, and a controller configured to control an entry of the clock supply circuit into the power-down mode in response to a locking signal, which represents that the clock supply circuit has been locked, and the power-down signal.

7 Claims, 5 Drawing Sheets

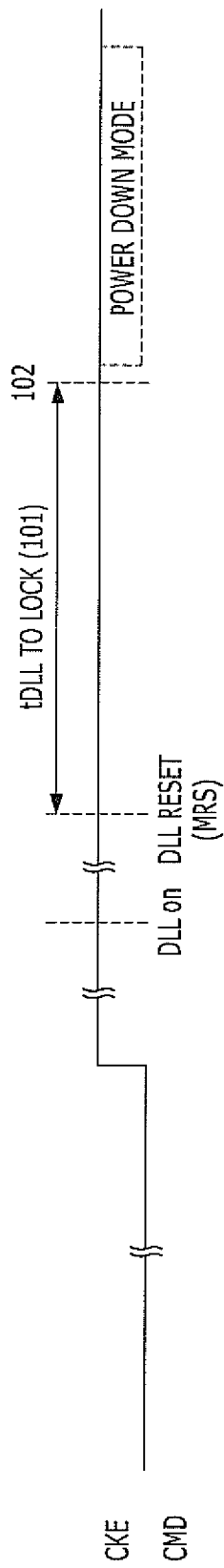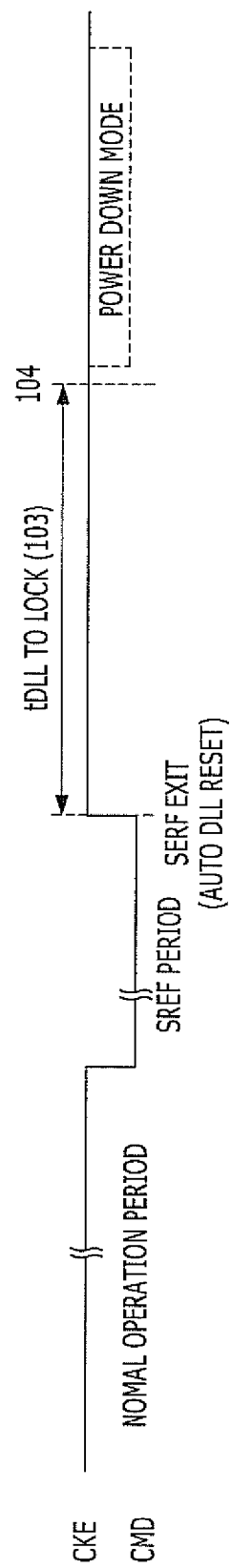

SEMICONDUCTOR DEVICE, METHOD FOR OPERATING THE SAME, AND MEMORY SYSTEM INCLUDING THE SAME

CROSS-REFERENCE TO RELATED APPLICATIONS

The present application claims priority of Korean Patent Application No. 10-2010-0039888, filed on Apr. 29, 2010, which is incorporated herein by reference in its entirety.

BACKGROUND OF THE INVENTION

Exemplary embodiments of the present invention relate to the control of a power-down mode of a semiconductor device.

Semiconductor devices operating in synchronization with a clock include a clock supply circuit that generates an internal clock, which is to be used in the semiconductor devices, by using an external clock supplied from the outside of the semiconductor devices. Such a clock supply circuit may include a delay locked loop (DLL), a phase locked loop (PLL) and the like. The delay locked loop or the phase locked loop may supply a normal internal clock after a delay-locking or a phase-locking is completed.

Meanwhile, the semiconductor devices may have a power-down mode in order to reduce the amount of current consumed, because, the semiconductor devices may have a period where no operation is performed. For example, a memory device may enter a power-down mode during the period when no data is inputted and outputted, where it does not perform operations on memory blocks except for a specific internal block.

However, entering the power-down mode may be limited during a period for delay-locking or phase-locking of the internal clock. If the semiconductor devices enter the power-down mode, a delay-locking or phase-locking information is necessary for a normal operation to be performed after the semiconductor devices are switched from the power-down mode to a normal mode.

If the semiconductor devices enter the power-down mode during the period the clock supply circuit is not locked, the clock supply circuit does not have locking information, and thus the semiconductor devices may not perform a normal operation after they are switched from the power-down mode to the normal mode. For this reason, the semiconductor devices using the clock supply circuit have a limitation in entering the power-down mode until the clock supply circuit is locked.

FIGS. 1A and 1B are diagrams illustrating the period when an entry into a power-down mode is acceptable and the period when the entry into the power-down mode is unacceptable in a known memory device.

Referring to FIG. 1A, during an initial operation of the memory device, a delay locked loop is turned on (DLL on) and is reset by mode register setting (MRS) (DLL reset), so that the delay locked loop starts an operation for locking. However, it is defined that the entry into the power-down mode is unacceptable during the time 101 (tDLL TO LOCK) required for a completion of the delay-locking or the phase-locking after the delay locked loop is reset. This is because the delay locked loop may not have locking information if a semiconductor device enters the power-down mode during the time 101.

Meanwhile, it is defined that the entry into the power-down mode is acceptable after the time point 102 at which the locking of the delay locked loop has been completed. Accordingly, a memory controller gives a command for the entry into the power-down mode to the memory device after the time point 102.

FIG. 1B illustrates the operation when the memory device is switched from a self-refresh mode to a normal mode. When the self-refresh mode of the memory device is ended (SERF EXIT), the delay locked loop becomes reset (AUTO DLL RESET) and starts an operation for the delay-locking again after the reset. It is defined that the entry into the power-down mode is unacceptable during the period 103 (tDLL TO LOCK) when the delay locked loop becomes locked again.

In the semiconductor devices including the clock supply circuit that supplies an internal clock, most internal circuits other than the clock supply circuit operate in synchronization with the internal clock generated by the clock supply circuit. Thus, such internal circuits need not actually operate during the period when the locking of the clock supply circuit is not completed.

The entry into the power-down mode is unacceptable during the period when the clock supply circuit operates to lock a clock (from several hundreds of clocks to several thousands and several tens of thousands of clocks). For this reason, the internal circuits operating in synchronization with the internal clock do not enter the power-down mode, and thus a current consumption of the semiconductor devices may increase.

SUMMARY OF THE INVENTION

An embodiment of the present invention is directed to reduce the amount of current consumed in a semiconductor device by enabling internal circuits other than a clock supply circuit to enter a power-down mode during the period when the clock supply circuit operates for locking.

In accordance with an exemplary embodiment of the present invention, a semiconductor device includes a clock supply circuit configured to generate an internal clock by using an external clock, an internal circuit configured to operate in synchronization with the internal clock and enter a power-down mode in response to a power-down signal, and a controller configured to control an entry of the clock supply circuit into the power-down mode in response to a locking signal, which represents that the clock supply circuit has been locked, and the power-down signal.

In accordance with another exemplary embodiment of the present invention, a method for operating a semiconductor device, which includes a clock supply circuit configured to generate an internal clock and an internal circuit configured to operate in synchronization with the internal clock, includes allowing the internal circuit to enter a power-down mode in response to a power-down signal applied from the outside of the semiconductor device; determining whether locking of the clock supply circuit has been completed; and allowing the clock supply circuit to enter the power-down mode in response to the power-down signal after the locking of the clock supply circuit has been completed.

In accordance with yet another exemplary embodiment of the present invention, a memory system includes a memory controller configured to generate a power-down signal for determining entry into a power-down mode, and the memory device comprising a clock supply circuit for generating an internal clock and an internal circuit operating in synchronization with the internal clock, here, the internal circuit is configured to directly enter the power-down mode in response to the power-down signal, and the clock supply circuit is configured to enter the power-down mode in response to the power-down signal after locking of the clock supply circuit.

In accordance with still another exemplary embodiment of the present invention, a method for operating a memory system includes allowing a power-down signal to be deactivated and applied to a memory device from a memory controller, allowing an operation of a clock supply circuit in the memory device to start in response to deactivation of the power-down signal, and allowing the power-down signal to be activated and applied to the memory device from the memory controller before the clock supply circuit is locked.

BRIEF DESCRIPTION OF THE DRAWINGS

FIGS. 1A and 1B are diagrams illustrating the period for which an entry into a power-down mode is possible and the period for which the entry into the power-down mode is impossible in a conventional memory device.

DESCRIPTION OF SPECIFIC EMBODIMENTS

Figure 2:
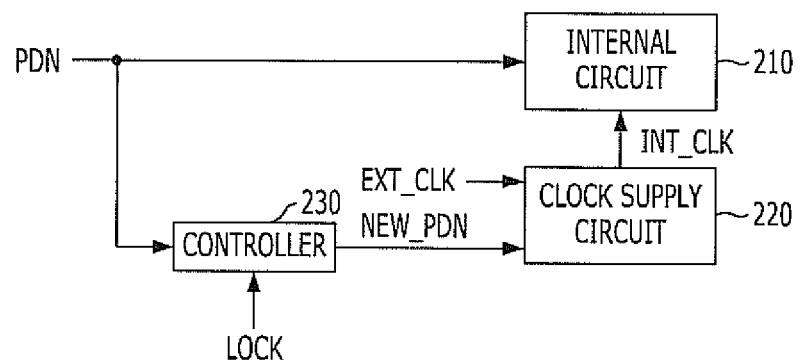
FIG. 2 is a configuration diagram of a semiconductor device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 2 is a configuration diagram of a semiconductor device in accordance with an embodiment of the present invention.

Referring to FIG. 2, the semiconductor device includes an internal circuit 210, a clock supply circuit 220, and a controller 230.

The internal circuit 210 represents a circuit in the semiconductor device, which operates in synchronization with an internal clock INT_CLK generated by the clock supply circuit 220. The internal circuit 210 is configured to enter a power-down mode in response to a power-down signal PDN applied from the outside of the semiconductor device. FIG. 2 illustrates an example in which the power-down signal PDN is directly applied to the internal circuit 210. However, the power-down signal PDN may also be applied to the internal circuit 210 through various paths according to the design of the semiconductor device.

The clock supply circuit 220 is configured to generate an internal clock INT_CLK by using an external clock EXT_CLK. An example of the clock supply circuit 220 is a delay locked loop (DLL), a phase locked loop (PLL) and the like. Here, the clock supply circuit 220 enters the power-down mode in response to a signal NEW_PDN outputted from the controller 230.

The controller 230 is configured to control the entry into the power-down mode of the clock supply circuit 220 in response to the power-down signal PDN and a locking signal LOCK. The locking signal LOCK represents that the clock supply circuit 220 has been locked. In the case in which the locking signal LOCK is deactivated, even if the power-down signal PDN is activated, the controller 230 controls the clock supply circuit 220 not to enter into the power-down mode. However, in the case in which the locking signal LOCK and the power-down signal PDN are activated, the controller 230 controls the clock supply circuit 220 to enter into the power-down mode. FIG. 2 illustrates an example in which the power-down signal PDN is directly applied to the controller 230. However, the power-down signal PDN may also be applied to the controller 230 through various paths according to the design of the semiconductor device.

The locking signal LOCK may be a signal activated if the locking of the clock supply circuit 220 has been completed, or a signal, which is activated after a certain time required for the locking of the clock supply circuit 220 lapses from the operation start time of the clock supply circuit 220, may be generated to be used as the locking signal LOCK.

In accordance with the exemplary embodiment of the present invention, even if the power-down signal PDN is activated, if the clock supply circuit 220 is not locked, the controller 230 substantially does not allow the clock supply circuit 220 to enter the power-down mode, but other circuits, e.g., the internal circuit 210, may enter the power-down mode. Consequently, the power-down signal PDN may be activated during the period when the clock supply circuit 220 is not locked.

Figure 3:
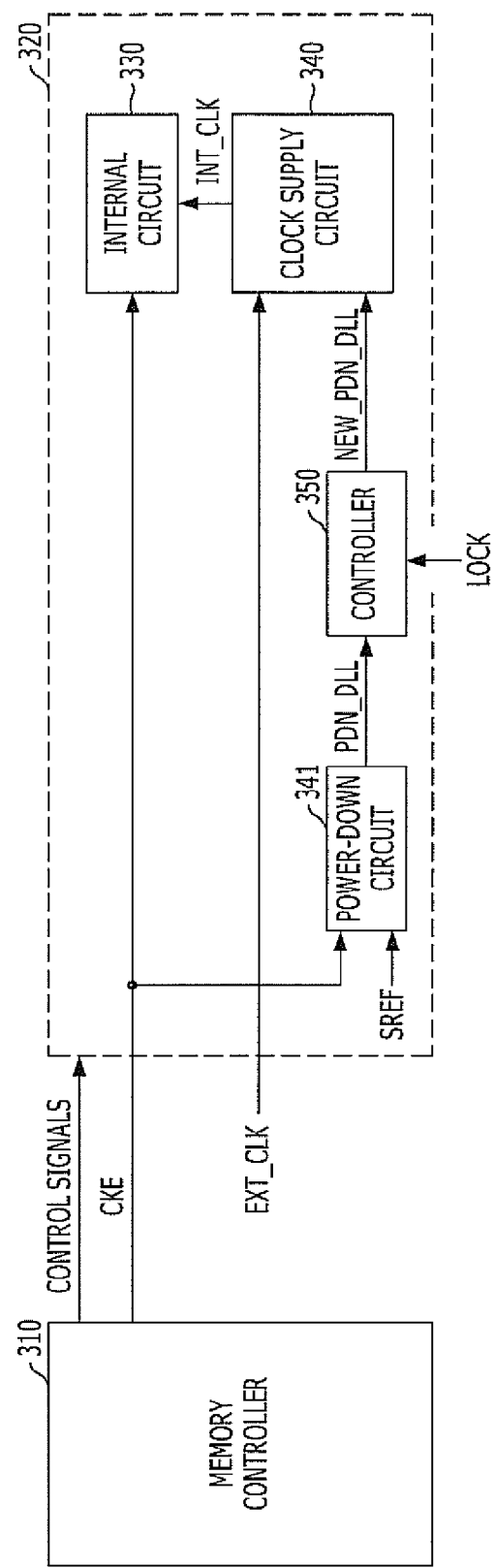
FIG. 3 is a configuration diagram of a memory system in accordance with an exemplary embodiment of the present invention.

FIG. 3 is a configuration diagram of a memory system in accordance with the exemplary embodiment of the present invention.

Referring to FIG. 3, the memory system includes a memory controller 310 and a memory device 320.

The memory controller 310 is configured to control the memory device 320. The memory controller 310 is configured to generate a plurality of control signals CONTROL SIGNALS for controlling the memory device 320, and a power-down signal CKE for determining an entry into the power-down mode. According to an example, a clock enable signal CKE may be used as the power-down signal CKE for controlling the power-down mode. A high level of the power-down signal CKE may represent a normal mode and a low level of the power-down signal CKE may represent the power-down mode.

The memory device 320 includes a clock supply circuit 340 for generating an internal clock INT_CLK and an internal circuit 330 operating in synchronization with the internal clock INT_CLK. The internal circuit 330 is configured to enter the power-down mode in response to the power-down signal CKE, but the clock supply circuit 340 is configured to enter the power-down mode in response to the power-down signal CKE after being locked.

The internal circuit 330 represents a circuit in the memory device, which operates in synchronization with the internal clock INT_CLK generated by the clock supply circuit 340. The internal circuit 330 may enter the power-down mode, for example, immediately after the power-down signal CKE is activated. FIG. 3 illustrates an example in which the power-down signal CKE is directly applied to the internal circuit 330. However, the power-down signal PDN may also be applied to the internal circuit 330 through various paths according to the design of the memory device.

A power-down circuit 341 is configured to generate a power-down signal PDN_DLL for the clock supply circuit 340 in response to the power-down signal CKE and a self-refresh signal SREF. A self-refresh mode of the memory device may be a kind of the power-down mode. However, in the self-refresh mode, the clock supply circuit 340 may be turned on. The power-down circuit 341 is configured to output the power-down signal PDN_DLL which is deactivated during the period when the self-refresh signal SREF is activated (high) even if the power-down signal CKE is activated. In accordance with the exemplary embodiment, the high level of the self-refresh signal SREF may represent activation (the self-refresh mode) and the low level of the self-refresh signal SREF may represent deactivation (not the self-refresh mode), and the high level of the power-down signal PDN_DLL may represent activation (the power-down mode) and the low level of the power-down signal PDN_DLL may represent deactivation (the normal mode). That is, the power-down circuit 341 is configured to generate the power-down signal PDN_DLL for the clock supply circuit 340 by processing the power-down signal CKE according to the characteristics of the memory device 320. If the semiconductor device is not in the self-refresh mode, the power-down signal PDN_DLL is activated if the power-down signal CKE is activated.

Even if the power-down signal PDN_DLL is activated, if the locking signal LOCK, representing that the clock supply circuit 340 has been locked, is not activated, a controller 350 controls the clock supply circuit 340 not to enter the power-down mode. The locking signal LOCK may be a signal activated after the locking of the clock supply circuit 340 has been completed, or a signal, which is activated after a certain time required for the locking of the clock supply circuit 340 lapses from the operation start time of the clock supply circuit 340, may be generated to be used as the locking signal LOCK.

In the memory system in accordance with the exemplary embodiment of the present invention, the internal circuit 330 enters the power-down mode, for example, immediately after the power-down signal CKE applied from the memory controller 310 is activated, but the clock supply circuit 340 of the memory device 320 enters the power-down mode, for example, only after the locking of the clock supply circuit 340 has been completed. Consequently, the internal circuit 330 may enter the power-down mode during the period when the locking of the clock supply circuit 340 is not completed. Furthermore, the memory controller 310 may activate and apply the power-down signal CKE to the memory device 320, regardless of the locking of the clock supply circuit 340.

That is, in the memory system in accordance with the embodiment of the present invention, the power-down signal CKE may be activated and applied to the memory device 320 from the memory controller 310 for the period 101 of FIG. 1A and the period 103 of FIG. 1B. As a result, the internal circuit 330 enters the power-down mode for the period 101 and the period 103.

Figure 4:
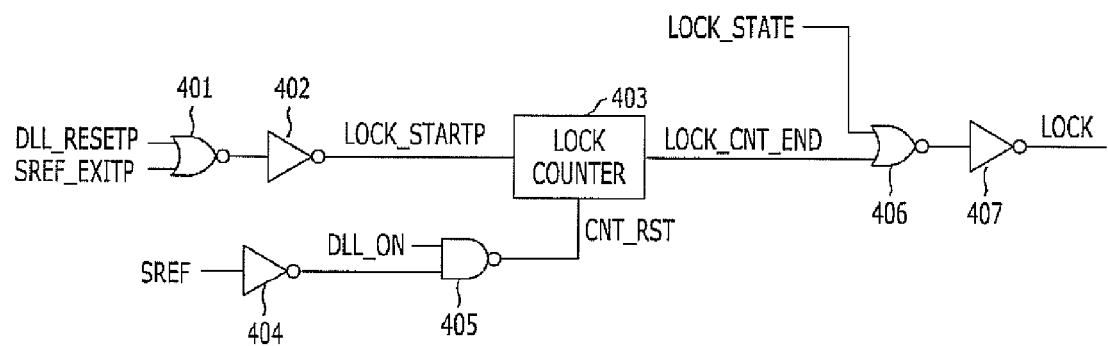
FIG. 4 is a diagram explaining a generation example of a locking signal of FIG. 3.

FIG. 4 is a diagram explaining a generation example of the locking signal of FIG. 3.

FIG. 4 shows a clock supply circuit 340 as a delay locked loop.

The delay locked loop 340 is reset by a reset pulse DLL_RESETP activated by mode register setting (MRS) and a reset pulse SREF_EXITP activated if the self-refresh mode is ended, and starts to operate. If the reset pulse DLL_RESETP or the reset pulse SREF_EXITP is activated, a locking start signal LOCK_STARTP is activated. Accordingly, the locking start signal LOCK_STARTP is activated when the delay locked loop 340 starts to operate. When time required for the locking of the delay locked loop 340 lapses from the activation time point of the locking start signal LOCK_STARTP, a lock counter 403 activates a locking count end signal LOCK_CNT_END. Thus, if the locking count end signal LOCK_CNT_END is activated, the locking of the delay locked loop 340 may have been completed. A reset signal CNT_RST inputted to the lock counter 403 allows the locking count end signal LOCK_CNT_END to be deactivated if a signal DLL_ON activated to a high level during the operation of the delay locked loop 340 falls to a low level, or the self-refresh signal SREF is activated to a high level.

A lock state signal LOCK_STATE is activated to a high level if the locking of the delay locked loop 340 is completed.

If the locking count end signal LOCK_CNT_END is activated to a high level or the lock state signal LOCK_STATE is activated to a high level, the locking signal LOCK is activated to a high level. Accordingly, since both the locking count end signal LOCK_CNT_END and the lock state signal LOCK_STATE represent that the delay locked loop 340 has been locked, the locking signal LOCK represents that the delay locked loop 340 has been locked.

According to the design, it is natural that the locking count end signal LOCK_CNT_END may be used as the locking signal LOCK, or the lock state signal LOCK_STATE may be used as the locking signal LOCK.

Figure 5:
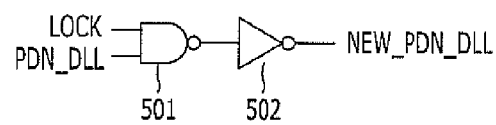
FIG. 5 is a configuration diagram of a controller of FIG. 3 in accordance with an exemplary embodiment of the present invention.

FIG. 5 is a configuration diagram of the controller of FIG. 3 in accordance with the embodiment of the present invention.

Referring to FIG. 5, the controller 350 may include a NAND gate 501, which receives the power-down signal PDN_DLL and the locking signal LOCK, and an inverter 502 coupled to an output terminal of the NAND gate 501.

The controller 350 activates its own output signal NEW_PDN_DLL only if both the power-down signal PDN_DLL and the locking signal LOCK are activated. Accordingly, even if the power-down signal CKE is activated and applied from the outside of the memory device 320 and the power-down signal PDN_DLL is activated, if the locking of the delay locked loop 340 is not completed, the delay locked loop 340 does not enter the power-down mode.

Figure 6:
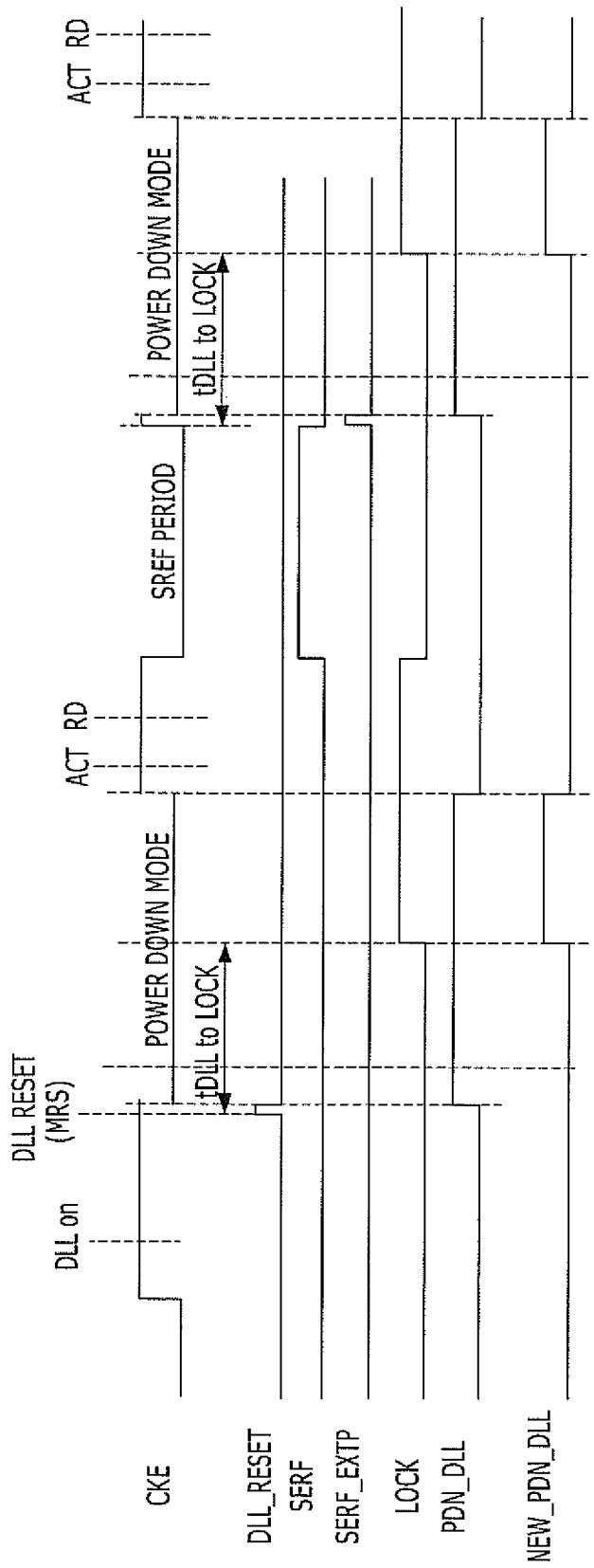
FIG. 6 is a timing diagram illustrating an operation of a memory device in accordance with an exemplary embodiment of the present invention.

FIG. 6 is a timing diagram illustrating an operation of the memory device in accordance with the exemplary embodiment of the present invention.

Referring to FIG. 6, at the time of the initial operation of the memory device 320, the delay locked loop 340 is turned on (DLL on). The delay locked loop 340 is reset by the mode register setting (DLL RESET (MRS)) and starts an operation for locking. The power-down signal CKE is activated to a low level. The output signal NEW_PDN_DLL of the controller 350, which is deactivated to a low level during the period when the locking signal LOCK is deactivated to a low level, and is activated to a high level only if the locking signal LOCK is activated to a high level, so that the delay locked loop 340 enters the power-down mode.

In the self-refresh mode, since the power-down signal CKE is activated to a low level, but the self-refresh signal SREF is activated to a high level, the delay locked loop 340 does not enter the power-down mode. If the self-refresh mode ends, the reset pulse SREF_EXITP is activated, and the delay locked loop 340 is reset and starts an operation for locking again. After the delay locked loop 340 is reset, the power-down signal CKE is activated to a low level. In the state in which the locking signal LOCK is activated to a low level, the output signal NEW_PDN_DLL of the controller 350 is deactivated to a low level. Only if the locking signal LOCK is activated to a high level, the output signal NEW_PDN_DLL of the controller 350 is deactivated to a high level, so that the delay locked loop 340 enters the power-down mode.

Hereinafter, a method for operating a semiconductor device in accordance with an exemplary embodiment of the present invention will be described with reference to FIG. 2. The method for operating the semiconductor device, which includes the clock supply circuit 220 configured to generate the internal clock INT_CLK and the internal circuit 210 configured to operate in synchronization with the internal clock INT_CLK, includes activating the power-down signal PDN applied from the outside of the semiconductor device, allowing the internal circuit 210 to enter the power-down mode in response to the power-down signal PDN, determining whether the locking of the clock supply circuit 220 has been completed, and allowing the clock supply circuit 220 to enter the power-down mode in response to the power-down signal PDN after the locking of the clock supply circuit 220 has been completed.

The internal circuit 210 enters the power-down mode in response to the power-down signal PDN, but the clock supply circuit 220 enters the power-down mode only when the locking completion of the clock supply circuit 220 is checked by the controller 230.

The exemplary embodiment of the present invention has a configuration in which an internal circuit enters a power-down mode when a power-down signal applied from the outside of a semiconductor device is activated, and a clock supply circuit enters the power-down mode after the locking of the clock supply circuit is completed.

Consequently, the power-down signal may be activated and applied from the outside of the semiconductor device at any time, and the internal circuit may enter the power-down mode even during the period when the clock supply circuit is not locked, so that the current consumption in the semiconductor device may decrease.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
  a clock supply circuit configured to generate an internal clock by using an external clock;
  an internal circuit configured to operate in synchronization with the internal clock and enter a power-down mode in response to a power-down signal irrespective of a locking operation of the clock supply circuit; and
  a controller configured to control an entry of the clock supply circuit into the power-down mode in response to the power-down signal and a locking signal after the clock supply circuit is locked, wherein the controller controls the clock supply circuit not to enter the power-down mode during the locking operation of the clock supply circuit.

2. The semiconductor device of claim 1, wherein the controller is configured to control the clock supply circuit not to enter the power-down mode if the locking signal is deactivated.

3. The semiconductor device of claim 1, wherein the locking signal is activated by the clock supply circuit if locking of the clock supply circuit is completed.

4. The semiconductor device of claim 1, wherein the locking signal is activated after time required for locking of the clock supply circuit lapses from an operation start time of the clock supply circuit.

5. The semiconductor device of claim 1, wherein the clock supply circuit includes a delay locked circuit or a phase locked circuit.

6. A method for operating a semiconductor device, which includes a clock supply circuit configured to generate an internal clock and an internal circuit configured to operate in synchronization with the internal clock, the method comprising:
  allowing the internal circuit to enter a power-down mode in response to a power-down signal applied from the outside of the semiconductor device irrespective of a locking operation of the clock supply circuit;
  determining whether locking of the clock supply circuit has been completed; and
  allowing the clock supply circuit to enter the power-down mode in response to the power-down signal after the locking of the clock supply circuit has been completed, wherein if the locking operation of the clock supply circuit is not completed, the clock supply circuit does not enter the power-down mode during the locking operation of the clock supply circuit.

7. The method of the semiconductor device of claim 6, wherein the clock supply circuit comprises a delay locked circuit or a phase locked circuit.

* * * * *